(12) United States Patent
Ichikawa et al.

(10) Patent No.: US 10,860,042 B2
(45) Date of Patent: Dec. 8, 2020

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventors: Atsuhiro Ichikawa, Ono (JP); Keita Ikai, Tokyo (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/601,957

(22) Filed: Oct. 15, 2019

(65) Prior Publication Data
US 2020/0225687 A1    Jul. 16, 2020

Related U.S. Application Data

(60) Provisional application No. 62/791,961, filed on Jan. 14, 2019.

(51) Int. Cl.
*H03K 17/567*  (2006.01)
*G05F 1/46*    (2006.01)
*H03K 17/16*   (2006.01)

(52) U.S. Cl.
CPC ............. *G05F 1/462* (2013.01); *H03K 17/16* (2013.01); *H03K 17/567* (2013.01); *H03K 2217/0063* (2013.01); *H03K 2217/0072* (2013.01); *H03K 2217/0081* (2013.01)

(58) Field of Classification Search
CPC ...... H01L 2924/00; H01L 2924/00014; H02M 3/158; H02M 3/1588; Y02B 70/1466; G05F 1/462; H03K 17/16; H03K 17/567; H03K 2217/0063; H03K 2217/0072; H03K 2217/0081
See application file for complete search history.

(56) References Cited

U.S. PATENT DOCUMENTS

2017/0288511 A1    10/2017  Oljaca et al.
2018/0004238 A1*    1/2018  Shen ................. G05F 1/462

* cited by examiner

*Primary Examiner* — Sibin Chen
(74) *Attorney, Agent, or Firm* — Robert F. Hightower (57) ABSTRACT

In one embodiment, a control circuit for a high side driver forms alternate signals to control a store mode and a maintain mode. An embodiment of the control circuit stores a voltage that is greater than an input voltage which results in storing a large charge for at least a portion of one of the cycles. The charge is used to supply operating voltage to the driver for at least a portion of another of the cycles.

20 Claims, 3 Drawing Sheets

METHOD OF FORMING A SEMICONDUCTOR DEVICE

PRIORITY CLAIM TO PRIOR PROVISIONAL FILING

This application claims priority to prior filed Provisional Application No. 62/791,961 entitled "METHOD OF FORMING A SEMICONDUCTOR DEVICE" filed on Jan. 14, 2019, and having common inventors Ichikawa et al. which is hereby incorporated herein by reference

CROSS-REFERENCE TO RELATED APPLICATIONS

This application is related to an application entitled "METHOD OF FORMING A SEMICONDUCTOR DEVICE", having a common assignee, and inventors Ichikawa et al. which is filed concurrently herewith and which is hereby incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various circuits and methods to control switches or transistors that were configured in an H-bridge or half H-bridge configuration. These types of configurations generally were used in various applications including power supply controllers, boost mode power supply controllers, motor drivers, and other circuits. The control circuits generally required a high-voltage in order to enable the high-side transistor(s) of the H-bridge or half H-bridge configurations. For example, an N-channel transistor usually required a higher voltage.

Some control circuits utilized a bootstrap circuit to provide the high-voltage. Some other circuits utilized charge pump circuits to generate the high-voltage. Both of these configurations generally required an external capacitor because the capacitor had to have a large value in order to supply sufficient current to drive the transistor. In some embodiments the capacitors were integrated onto a semiconductor device, these integrated capacitors occupied a large area on the semiconductor device and added additional cost to the semiconductor device.

Additionally, the bootstrap circuit configuration often could not enable the high-side transistors with a substantially 100% duty cycle.

Accordingly, it is desirable to have a circuit and method that generates the high-voltage needed for enabling the transistors, that can provide the high-voltage with a substantially 100% duty cycle, that can use smaller values of capacitors, that occupies a smaller area of a semiconductor device, and/or that reduces electromagnetic interference generated noise.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

The embodiments illustrated and described hereinafter suitably may have embodiments and/or may be practiced in the absence of any element which is not specifically disclosed herein.

DESCRIPTION OF THE DRAWINGS

Figure 1:
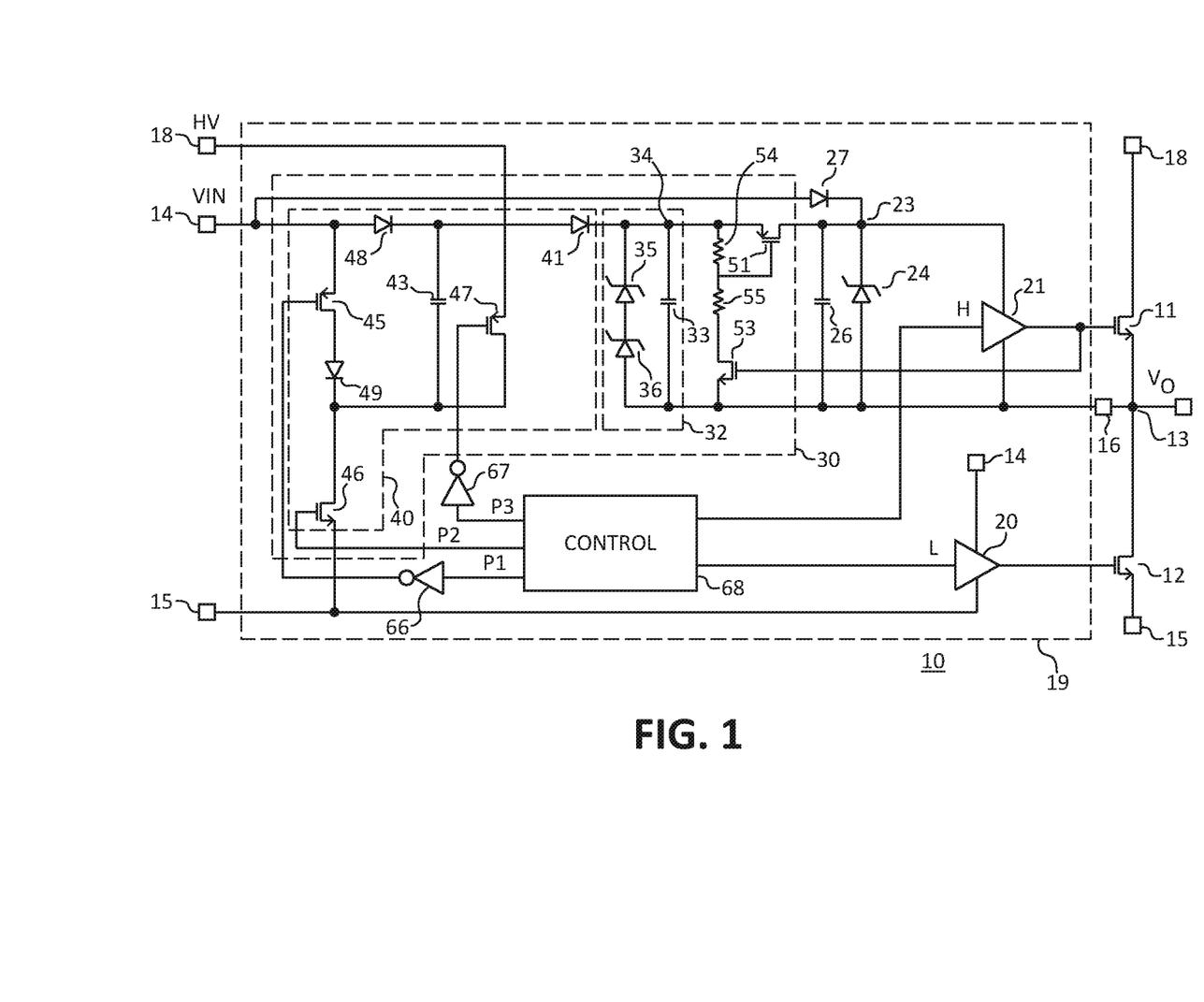
FIG. 1 schematically illustrates an example of a portion of an embodiment of a half H-bridge circuit that includes a control circuit in accordance with the present invention.

FIG. 1 schematically illustrates an example of a portion of an embodiment of a half H-bridge circuit 10 that includes a control circuit 19. Circuit 19 is configured to alternately drive a high-side switch, such as for example a transistor 11, and a low-side switch, such as for example a transistor 12, to form an output voltage (VO) on an output 16. The switches, such as for example transistors 11 and 12, can be connected in a half H-bridge configuration such as connected together in series in a stacked configuration. An embodiment may include that the switches, such as for example transistors 11 and 12, are connected together at a bridge node 13. In some embodiments, output 16 may be connected to node 13. In some embodiments, transistors 11-12 and node 13 may be included as a part of, or within, circuit 19. Circuit 10 receives an operating voltage or input voltage (Vin) between a voltage input 14 and a common return 15. In some embodiments, return 15 may be connected to receive a common reference voltage. In an embodiment, the common reference voltage may be a ground reference voltage. The input voltage received on input 14 typically is a value for operating circuit 19 and some of the elements thereof. In some embodiments the input voltage may be approximately five volts (5V) and in other embodiments may be approximately three volts (3V), or alternately less.

Circuit 10 also receives a high-voltage (HV) on a high-voltage (HV) input 18 which is received by transistor 11. The high-voltage (HV) typically is much greater than the voltage received on input 14. In an embodiment, the input voltage may be substantially no greater than the high-voltage or alternately approximately equal to the high-voltage. An embodiment may include that the high-voltage may be less than the input voltage. An embodiment may include that the high-voltage may be two times greater than the voltage on input 14, and may be greater in other embodiments. In an embodiment, the high-voltage may be approximately twelve volts (12 V) or alternately approximately twenty four volts (24 V), or alternately greater.

Circuit 19 includes a high-side driver circuit or driver 21 that is coupled to drive the high-side switch, such as transistor 11 for example, and a low-side driver circuit or driver 20 that is configured to drive the low-side switch, such as transistor 12 for example. Because driver 20 is driving transistor 12 which, in an embodiment, is referenced to the common reference voltage, driver 20 can operate from a lower operating voltage than driver 21. Driver 20 may have an embodiment that receives the operating voltage received from input 14 as the operating voltage for driver 20. However, driver 21 requires a higher operating voltage in order to generate a higher drive voltage to enable transistor 11. For example, an embodiment of transistor 11 may be referenced to output 16 or to node 13. Driver 21 receives the higher operating voltage from a node 23. In some embodiments, the higher operating voltage may be referred to as a bootstrap voltage.

Circuit 19 includes a voltage generation circuit 30 that is configured to form the bootstrap voltage for operating driver 21. As will be seen further hereinafter, circuit 19, or alternately circuit 30, is configured to alternately operate in a store mode and a maintain mode. In the store mode, circuit 19 is configured to store a charge that will supply a current for driver 21 and to assist in forming the bootstrap voltage. In the maintain mode, circuit 19 is configured to supply the bootstrap voltage and to supply a maintain current to driver 21. Circuit 19 also includes a capacitor 26 which may assist in supplying the bootstrap voltage to driver 21. An embodiment of circuit 30 may also include a diode 27 to assist forming the bootstrap voltage.

Circuit 30 includes a charging circuit 40 and a storage circuit 32. Circuit 30 also includes a transfer circuit that includes a transfer transistor 51, a transistor 53, and resistors 54-55. Charging circuit 40 includes transistors 45, 46, and 47 and a flying capacitor 43. In some embodiments, transistor 47 has a high breakdown voltage, for example a high drain-to-source breakdown voltage. For example, the breakdown voltage of transistor 47 may be higher than the voltage received from input 18. An example embodiment may include that transistor 47 may have a drain-to-source breakdown voltage of at least forty volts (40V). An embodiment may include that transistors 45 and 46 may also have a high breakdown voltage. In an embodiment, transistor 47 may have higher breakdown voltage than transistors 45-46. Circuit 40 may also include blocking diodes 41, 48, and 49. Storage circuit 32 may have a storage capacitor 33 and may have optional diodes 35 and 36. Circuit 30 may have an embodiment wherein the capacitance of capacitor 33 is larger than the capacitance of capacitor 43. In an embodiment, diodes 35 and 36 may assist in protecting capacitor 33 from excessive voltages. An embodiment may include that diodes 35 and 36 may be Zener diodes.

A controller or control circuit 68 of circuit 19 generates control signals to control transistors 11-12 and to also control circuit 40. For example, to control transistors 45-47.

Figure 2:
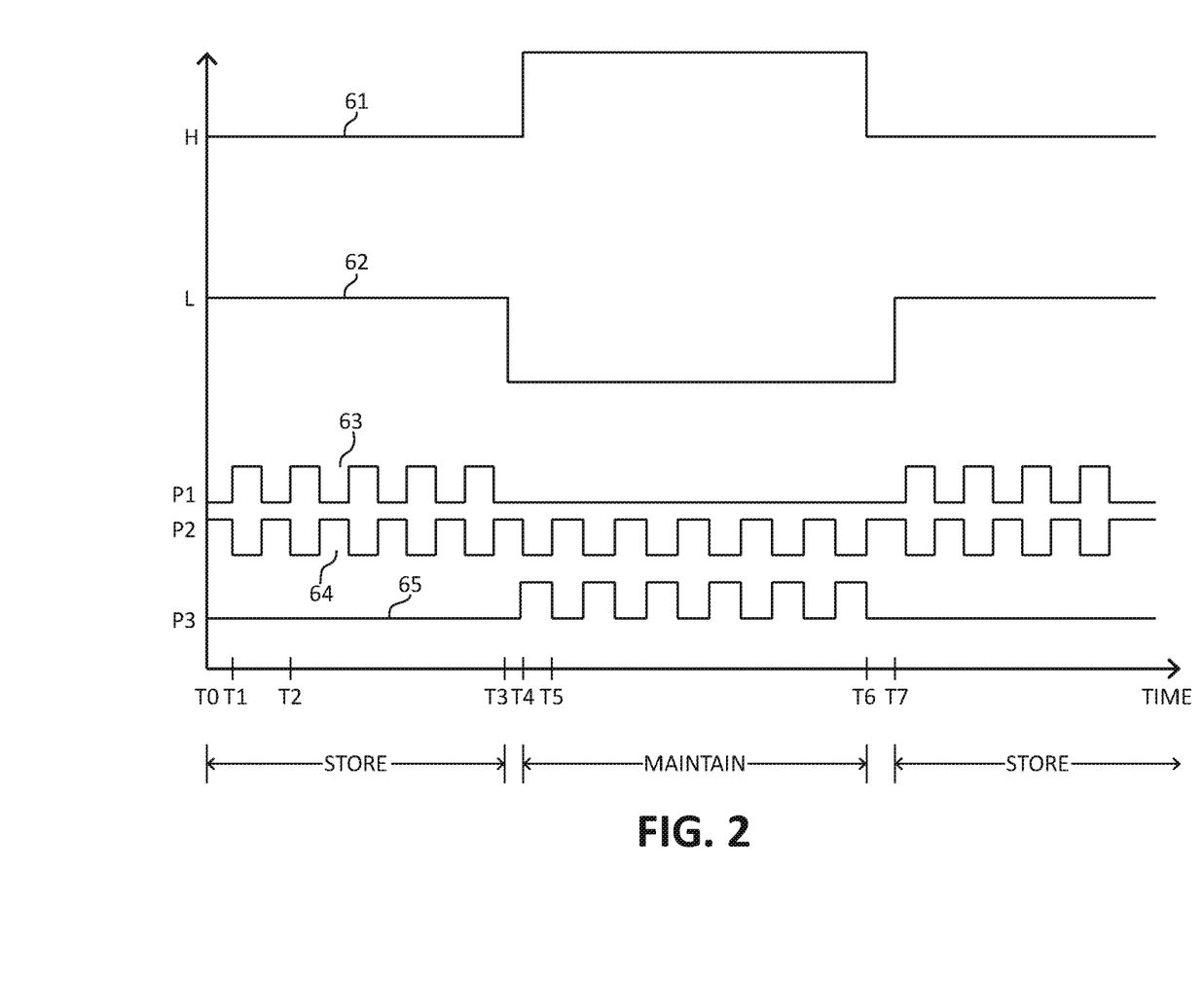
FIG. 2 is a graph having plots that illustrate some of the signals that may be generated during the operation of an embodiment of the circuit of FIG. 1 in accordance with the present invention.

FIG. 2 is a graph having plots that illustrate some of the signals that may be generated during the operation of an embodiment of circuit 19. The abscissa indicates time and the ordinate indicates increasing value of the illustrated signal. A plot 61 illustrates a high-side control (H) signal that is used to enable transistor 11, and a plot 62 illustrates a low-side control (L) signal used to enable transistor 12. Those skilled in the art will appreciate that drivers 20 and 21 are illustrated as non-inverting drivers such that the asserted state of the H and L signals have a positive logic, however, the drivers may have other embodiments and the asserted state of the H and L signals may have different values.

A plot 63 illustrates a P1 control signal used to enable transistor 45, a plot 64 illustrates a P2 control signal used to enable transistor 46, and a plot 65 illustrates a P3 control signal used to enable transistor 47. For simplicity of the explanation, signals P1-P3 are illustrated with an active state illustrated as a high or positive level. However, in an embodiment, transistors 45 and 47 are P-channel transistors that are enabled when the corresponding control signal is at a lower level, therefore, inverters 66 and 67 are used to invert signals P1 and P3 in order to enable transistors 45 and 47. Those skilled in the art will appreciate that in some embodiments the P1 and P3 control signals may be inverted and inverters 66 and 67 may be omitted or alternately the transistors may be other types of transistors. This description has references to FIGS. 1-2.

To assist in operation, circuit 68 is configured to operate transistors 45-47 at a higher frequency than the frequency at which transistors 11 and 12 are operated. In one example embodiment, transistors 45-47 may be enabled at a frequency of greater than one (1) MHz. In other embodiments, the frequency may be at least six (6) MHz. Transistors 11-12 may, in an embodiment, be operated at frequencies less than approximately one hundred (100) KHz. An embodiment may include that transistors 11-12 may be operated at approximately twenty (20) KHz.

In the store mode, circuit 19 is configured to operate circuit 40 to form an interim charge on capacitor 33. For at least a portion of a time interval that low-side transistor 12 is enabled and high-side transistor 11 is disabled, control circuit 68 operates transistors 45-47 such that circuit 40 operates in the store mode in order to store charge on capacitor 33 as the interim charge. For example, circuit 68 may form a plurality of store cycles such that each store cycle alternately enables transistors 45 and 46 to store charge while transistor 12 is enabled and transistor 11 is disabled. In a store cycle, transistors 45 and 46 are alternately enabled mutually exclusively wherein neither of transistors 45 and 46 are enabled at the same time. This may also be referred to as being enabled out-of-phase with each other.

Assume for example, that at a time T0 the L signal is high such that transistor 12 is enabled and the H signal is low such that transistor 11 is disabled. At time T0, signals P1 and P3 are negated and signal P2 is asserted thus transistors 45 and 47 are disabled and transistor 46 is enabled. Enabling transistor 46 causes current to flow from input 14 through diode 48 to capacitor 43 and through transistor 46 thereby charging capacitor 43. The voltage stored on capacitor 43 is substantially the input voltage or alternately the input voltage minus a drop of diode 48. In an embodiment, the input voltage may be approximately five volts (5V) and the voltage stored on capacitor 43 may be approximately four and one-half volts (4.5 V). Storing the voltage on capacitor 43 results in storing a charge on capacitor 43. At a time T1, circuit 30 disables transistor 46 and enables transistor 45. For example, circuit 68 may negate signal P2 then assert signal P1. Enabling transistor 45 connects capacitor 43 in series with the input voltage from input 14 and forms an interim voltage across capacitor 33 that is substantially the input voltage plus the voltage stored on capacitor 43, thus, storing the interim voltage on capacitor 33. Because transistor 12 is enabled and transistor 11 is disabled, the lower terminal of capacitor 33 is held at substantially the value of the common reference voltage in return 15. In an embodiment, this assists in storing the interim voltage on capacitor 33. Storing the interim voltage results in storing the interim charge on capacitor 33. For the embodiment of the input voltage of approximately five volts (5V), the voltage applied to capacitor 33 may be approximately five volts (5V) minus the voltage drop of diode 49, for example four and one-half volts (4.5 V), plus the four and one-half volts (4.5V) stored on capacitor 43 or approximately nine volts (9V). Thus, circuit 30 has completed one store cycle, for example T0 through T1. Circuit 30 is configured to form a plurality of these store cycles during the interval that transistor 12 is enabled and transistor 11 is disabled.

Subsequently at a time T2, circuit 30 begins another store cycle and again charges capacitor 43 by disabling transistor 45 and then enabling transistor 46. Circuit 30 subsequently enables transistor 45 to again store the interim voltage and charge on capacitor 33. This store cycle of charging capacitor 43 followed by storing charge on capacitor 33 is repeated as transistors 45 and 46 are alternately enabled during the time interval that transistor 12 is enabled and transistor 11 is disabled. Those skilled in the art will understand that capacitor 33 may not be charged completely to the interim charge or voltage during the first store cycle that transistor 45 is enabled but that the voltage or charge stored on capacitor 33 steady increases to the interim charge or voltage over a few of the store cycles.

Since the H signal is negated, transistor 53 is disabled which results in transistor 51 being disabled. Therefore, during the store mode, the charge on capacitor 33 is not coupled to capacitor 26.

Subsequently at a time T3, circuit 19 disables transistor 12 while transistor 11 is disabled. In an embodiment, circuit 30 also stops operating in the store mode, thus, stops alternately switching transistors 45 and 46 as illustrated by signal P1 being negated and P2 being asserted at time T3.

During the store mode, capacitor 33 is charged to a voltage value that is substantially twice the input voltage on input 14 which results in storing the interim charge on capacitor. In an embodiment, the voltage at node 34 also increases. Since capacitor 33 is charged to a voltage substantially twice the input voltage, the charge stored on capacitor 33 is equivalent to a charge that would be stored on a capacitor having twice the capacitance of capacitor 33 and charged to the input voltage. Thus, the sequence of charging capacitor 33 to a voltage greater than the input voltage stores a large charge on capacitor 33 and facilitates using a smaller capacitance value to obtain the amount of charge that is needed to subsequently supply current to driver 21. Using a smaller capacitance value reduces the cost of the semiconductor device on which circuit 19 is formed.

At a time T4, circuit 19 controls driver 21 to enable transistor 11. For example, circuit 68 may assert the H signal to enable transistor 11, and may also keep the L signal negated to keep transistor 12 disabled. Notice that there is a non-overlap time interval (from time T3 to T4) between transistor 12 being disabled and transistor 11 being enabled in order to minimize shoot-through currents and avoid damaging transistors 11 and 12. During this non-overlap time interval, transistors 45 and 47 are disabled, transistor 46 is enabled, and both the store and the maintain modes are disabled. In an embodiment, capacitor 43 may be charged during the interval between T3 and T4 that transistors 11 and 12 are both disabled.

For at least a portion of the time interval that transistor 11 is enabled and transistor 12 is disabled, circuit 19 is configured to operate in the maintain mode to supply the bootstrap voltage and the maintain current to driver 21. For example, circuit 19 may be configured to begin operating in the maintain mode at time T4, or alternately just after T4. In an embodiment, controlling driver 21 to enable transistor 11 results in coupling the interim charge or voltage stored on capacitor 33 to driver 21 as the bootstrap voltage and to supply current for operating driver 21 during the enabling of transistor 11. In an embodiment, asserting the H signal to enable transistor 11 may also enable transistor 53 which pulls the gate of transistor 51 low to enable transistor 51 to couple node 23 to both node 34 and capacitor 33. Thus, circuit 30 connects capacitor 33 to supply the interim charge and voltage to driver 21 to assist in enabling transistor 11. Since capacitor 33 is referenced to output 16, the voltage from capacitor 33 is added to the output voltage (Vo) on output 16 to become the bootstrap voltage at node 23 for operating driver 21. Those skilled in the art will appreciate that because transistor 11 is enabled the output voltage (Vo) is substantially the high-voltage (HV) from input 18, thus, capacitor 33 is referenced to substantially the high-voltage (HV). Also, some of the interim charge from capacitor 33 is transferred to capacitor 26 so that capacitor 26 can assist in supplying the maintain current to driver 21.

During the maintain mode, circuit 68 may be configured to control transistors 45-47 to continue to supply the bootstrap voltage and the maintain current to driver 21. For at least a portion of the time interval that transistor 11 is enabled and transistor 12 is disabled, circuit 68 forms a plurality of maintain cycles such that each maintain cycle alternately enables transistors 46 and 47 to store charge on capacitor 43 and to supply the bootstrap voltage and the maintain current to driver 21. In a maintain cycle, transistors 46 and 47 are alternately enabled mutually exclusively wherein neither of transistors 46 and 47 are enabled at the same time, thus, out-of-phase with each other.

At time 14 or alternately just after T4, circuit 19 may be configured to enable transistor 47. Enabling transistor 47 couples the high voltage (HV) from input 18 in series with capacitor 43 and applies the bootstrap voltage to node 23 that is substantially the high voltage (HV) plus the voltage stored on capacitor 43. Because transistor 11 is enabled and is applying the high voltage (HV) to output 16, driver 21 is referenced to the high-voltage (HV) on output 16. Since the voltage from capacitor 43 is also coupled to the HV, capacitor 43 is also referenced to the HV thus the voltage on capacitor 43 becomes the bootstrap voltage for operating driver 21, and capacitor 43 also supplies the maintain current. For example, a terminal of capacitor 43 is connected to the HV through transistor 47, and a second terminal of capacitor 43 is connected to capacitor 33 through diode 41 and also connected to the power input terminal of driver 21 through transistor 51. In an embodiment, diode 48 blocks the input voltage and allows coupling capacitor 43 to the HV. Since capacitors 33 and 26 are also coupled to the HV on output 16, some of the charge from capacitor 43 may also be transferred to capacitors 33 and 26.

At a time T5, circuit 19 disables transistor 47 and enables transistor 46 to again charge capacitor 43 to substantially the voltage from input 14. For this portion of the maintain cycle, capacitors 33 and 26 supply the maintain current and the bootstrap voltage to operate driver 21 during this portion of the maintain cycle. This maintain cycle of storing charge on capacitor 43 and then referencing capacitor 43 to the HV to supply the bootstrap voltage and the maintain current to driver 21 continually repeats during at least a portion of the time interval that transistor 11 is enabled and transistor 12 is disabled.

At a time T6, circuit 68 controls driver 21 to disable transistor 11. For example, circuit 68 may negate the H signal to at least begin disabling transistor 11 while transistor 12 is disabled. Because transistors 11 and 12 are disabled, circuit 19 also stops the maintain mode and no longer alternately charges capacitor 43 and supplies the maintain current, the store mode remains disabled.

At a time T7, circuit 68 controls driver 20 to enable transistor 12. For example, circuit 68 may again assert the L signal to enable transistor 12 while transistor 11 is disabled. Note that there is a time interval between disabling transistor 11 and enabling transistor 12. During this time interval transistors 45-47 are not alternately switched. At time T7 circuit 68 again operates in the store mode to form store cycles that alternately operate transistors 45 and 46 as explained previously between times T0 to T3.

Those skilled in the art will appreciate that an embodiment may include that circuit 19, or alternately circuit 30, may be configured to continue forming the store cycles (thus, operating in the store mode) after controlling driver 20 to disable transistor 12 and prior to controlling driver 21 to enable transistor 11.

Those skilled in the art will also appreciate that respective diodes 41 and 48 may be replaced with transistors that are controlled to be enabled at for a portion of the time interval that transistors 45 and 46, respectively, are enabled.

Figure 3:
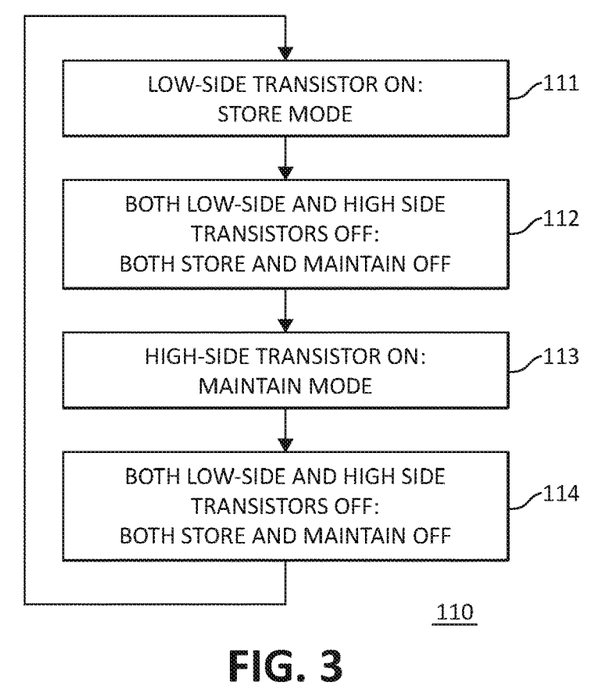
FIG. 3 illustrates a flowchart having steps that illustrate some of the modes of the circuit of FIG. 1 in accordance with the present invention.

FIG. 3 illustrates a flowchart 110 having steps that illustrate some of the modes of circuit 19 (FIG. 1). At a step 111, circuit 19 controls driver 20 to enable transistor 12 after transistor 11 is disabled, and circuit 19, or alternately circuit 30 operates in the store mode to form a plurality of store cycles. The maintain mode is disabled. At a step 112, circuit 19 controls driver 20 to disable transistor 12 and transistor 11 remains disabled, and circuit 19 disables operation of both the store mode and the maintain mode. An alternate embodiment may include that circuit 19 continues to operate in the store mode for step 112. At a step 113, circuit 19 controls driver 21 to enable transistor 11 and transistor 12 remains disabled, and circuit 19, or alternately circuit 30, operates in the maintain mode to form a plurality of maintain cycles. But the store mode remains disabled. At step 114, circuit 19 controls driver 21 to disable transistor 11 and transistor 12 remains disabled, and circuit 19, or alternately circuit 30, disables operating in the maintain mode and continues the disabling of operation in the store mode.

In order to facilitate the hereinbefore described operation and functionality, input 18 is connected to a source of transistor 47 and to a drain of transistor 11. Input 14 is commonly connected to an anode of diode 27, an anode of diode 48, and a source of transistor 45. A cathode of diode 48 is commonly connected to a first terminal of capacitor 43 and to an anode of diode 41. A cathode of diode 41 is commonly connected to the cathode of diode 35, node 34, a first terminal of capacitor 33, a first terminal of resistor 54, and to a source of transistor 51. A drain of transistor 51 is commonly connected to a first terminal of capacitor 26, node 23, a cathode of diode 27, the power input of driver 21, and a cathode of diode 24. A power return terminal of driver 21 is commonly connected to output 16, an anode of diode 24, a second terminal of capacitor 26, a source of transistor 53, a second terminal of capacitor 33, and an anode of diode 36. A cathode of diode 36 is connected to an anode of diode 35. A drain of transistor 53 is connected to a first terminal of resistor 55. A second terminal of resistor 55 is commonly connected to a gate of transistor 51 and to a second terminal of resistor 54. An output of driver 21 is connected to a gate of transistor 53 and is configured to be connected to a gate of transistor 11. An input of driver 21 is connected to an output of circuit 68 to receive the H signal. In an embodiment, transistor 11 has a source connected to output 16 and to a drain of transistor 12. A source of transistor 12 is connected to return 15. A gate of transistor 45 is connected to an output of inverter 66 which has an input connected to receive the P1 signal from circuit 68. A drain of transistor 45 is connected to the anode of diode 49. A cathode of diode 49 is commonly connected to a second terminal of capacitor 43, a drain of transistor 47, and a drain of transistor 46. A source of transistor 46 is connected to return 15, and a gate of transistor 46 is connected to receive the P2 signal from circuit 68. A gate of transistor 47 is connected to an output of inverter 67 which has an input of connected to receive the P3 signal from circuit 68. Driver 20 has an input connected to receive the L signal from circuit 68, and has an output configured to be connected to a gate of transistor 12.

Figure 4:
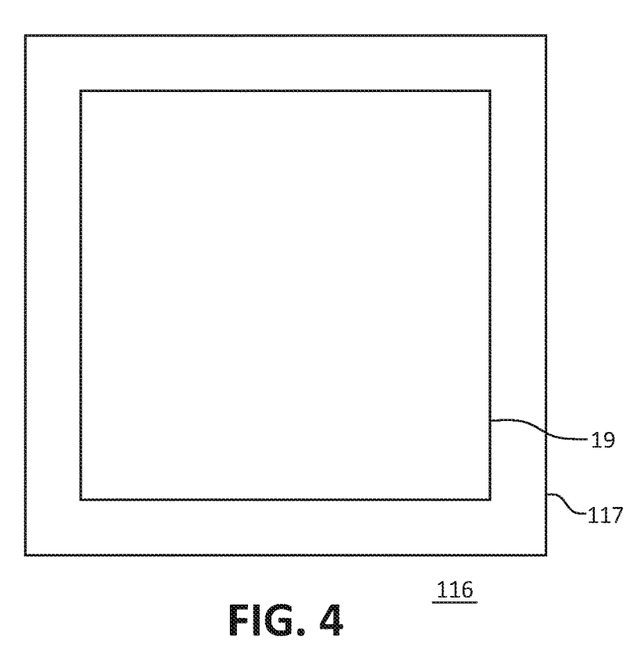
FIG. 4 illustrates an enlarged plan view of a semiconductor device that includes the circuit of FIG. 1 in accordance with the present invention.

FIG. 4 illustrates an enlarged plan view of a portion of an embodiment of a semiconductor device or integrated circuit 116 that is formed on a semiconductor die 117. In an embodiment, circuit 19 or circuit 30 may be formed on die 117. Die 117 may also include other circuits that are not shown in FIG. 4 for simplicity of the drawing. The circuit or integrated circuit 19 may be formed on die 117 by semiconductor manufacturing techniques that are well known to those skilled in the art.

From all the foregoing, one skilled in the art will appreciate that an example of an embodiment of a control circuit for a high-side driver may comprise:

the control circuit, such as for example circuit 19, configured to form a first signal, such as for example the H signal, to control a high-side transistor, such as for example transistor 11, and to form a second signal, such as for example the L signal, to control a low-side transistor, such as for example transistor 12, to form an output voltage, such as for example on output 16, from a high-voltage, such as for example the HV on input 18;

a first input, such as for example input 18, for receiving the high-voltage;

a second input, such as for example input 14, for receiving an input voltage, such as for example the Vin voltage, that is less than the high-voltage;

a first capacitor, such as for example capacitor 43;

a second capacitor, such as for example capacitor 33;

a first driver, such as for example driver 21, coupled to receive the first signal and configured to enable the high-side transistor in response to an asserted state of the first signal;

a second driver, such as for example driver 20, coupled to receive the second signal and configured to enable the low-side transistor in response to an asserted state of the second signal;

a voltage generation circuit, such as for example circuit 30, configured to form a plurality of store cycles for at least a portion of the asserted state of the second signal, a first store cycle of the plurality of store cycles including alternately storing substantially the input voltage on the first capacitor to store a first charge on the first capacitor for a first portion of the first store cycle, and to subsequently couple the first capacitor in series with the input voltage to form a second charge and a second voltage on the second capacitor for a second portion of the first store cycle; and the voltage generation circuit configured to form a plurality of maintain cycles for at least a portion of the asserted state of the first signal, a first maintain cycle of the plurality of maintain cycles including coupling the first capacitor in series between the second capacitor and the high-voltage for a first portion of the first maintain cycle, and subsequently storing substantially the input voltage on the first capacitor to store the first charge on the first capacitor for a second portion of the first maintain cycle.

An embodiment may include that the voltage generation circuit may be configured to couple the second capacitor to the first driver in response to asserting first signal.

In an embodiment, the voltage generation circuit may include transferring at least a portion of the first charge to the second capacitor for the second portion of the first store cycle.

In an embodiment, the control circuit may be configured to inhibit forming both the store cycles and the maintain cycles in response to negating both the first signal and the second signal.

An embodiment may include that the control circuit may be configured to continue forming the store cycles in response to asserting the second signal for at least a portion of the interval that the first signal remains negated.

The voltage generation circuit may have an embodiment wherein the control circuit includes a first transistor, such as for example transistor 47, coupled to a first terminal of the first capacitor and also coupled to receive the high-voltage wherein the control circuit enables the first transistor to couple the first capacitor in series between the second capacitor and the high-voltage for the first portion of the first maintain cycle.

An embodiment may include a first transistor, such as for example transistor 46, coupled to a first terminal of the first capacitor and wherein the control circuit enables the first transistor to couple the first capacitor in series between the input voltage and a common reference voltage to store the first charge on first capacitor.

In an embodiment, a second transistor, such as for example transistor 47, may be coupled to the first terminal of the first capacitor and also coupled to receive the high-voltage wherein the control circuit enables the second transistor to couple the first capacitor in series between the second capacitor and the high-voltage for the first portion of the first maintain cycle.

Another embodiment may include a second transistor, such as for example transistor 51, coupled to a first terminal of the second capacitor and also coupled to a power input of the first driver wherein the voltage generation circuit enables the second transistor to couple the second capacitor to supply current to the first driver in response to asserting the first signal.

Those skilled in the art will appreciate that an example of a method of forming a control circuit for a high-side driver may comprise:

configuring the control circuit, such as for example circuit 19, to control a first driver, such as for example driver 21, to operate a first switch, such as for example 11, and to control a second driver, such as for example driver 20, to operate a second switch, such as for example the switch of transistor 12, to form an output voltage, such as for the voltage on output 16, from a first voltage, such as for example the HV;

configuring the control circuit to receive an input voltage, such as for example the voltage on input 14, and to form an operating voltage for the second driver from the input voltage;

configuring the control circuit to store on a first capacitor, such as for example capacitor 33, an interim voltage that is no less than substantially twice the input voltage wherein the control circuit is configured to store the interim voltage on the first capacitor for at least a portion of a first time interval that the second switch is enabled;

configuring the control circuit to couple the first capacitor to supply current and voltage to operate the first driver in response to controlling the first driver to enable the first switch wherein the first capacitor is referenced to substantially the output voltage; and configuring the control circuit to couple a second capacitor, such as for example capacitor 43, in series between the first voltage and the first capacitor to supply current and voltage to the first driver for a second time interval that the first driver is controlled to enable the first switch and to subsequently charge a second capacitor, such as for example capacitor 43, from the input voltage for a third time interval that the first driver is controlled to enable the first switch.

The method may have an embodiment that also includes configuring the control circuit to initiate the second time interval in response to controlling the first driver to enable the first switch.

An embodiment may include configuring the control circuit for a sequence to store on the first capacitor the interim voltage includes configuring the control circuit to couple the second capacitor to be charge to substantially the input voltage for a first portion of the first time interval and to subsequently be coupled between the input voltage and second capacitor to store the interim voltage on the first capacitor for a second portion of the first time interval.

Another embodiment may include configuring the control circuit to continually repeat the sequence for the first time interval.

An embodiment of the method may include configuring the control circuit to couple the second capacitor in series between the first voltage and the first capacitor includes referencing the second capacitor to the output voltage.

An embodiment may include configuring the control circuit to couple the second capacitor in series between the first voltage and the first capacitor includes coupling a first transistor, such as for example transistor 47, to receive the first voltage and to couple the first voltage to a first terminal of the second capacitor wherein a second terminal of the second capacitor is coupled to the first capacitor.

Those skilled in the art will also appreciate that an example of a method of forming semiconductor device may comprise:

configuring a control circuit, such as for example circuit 19, to control a first driver, such as for example driver 21, to operate a first switch, such as for example the switch of transistor 11, and to control a second driver, such as for example driver 20, to operate a second switch, such as for example the switch of transistor 12, to form an output voltage, such as for example the voltage on output 16, from a first voltage, such as for example the HV;

configuring an input, such as for example input 14, of the control circuit for receiving an input voltage, such as for example Vin;

configuring the control circuit to form an interim voltage, such as for example the voltage on capacitor 33, that is greater than the input voltage including forming the interim voltage for at least a portion of a first time interval that the second switch is enabled wherein the interim voltage is formed from the input voltage; and configuring the control circuit to couple the first driver to receive substantially the interim voltage to supply current and voltage to operate the first driver in response to controlling the first driver to enable the first switch.

The method may have an embodiment that may include configuring the control circuit to form a second voltage, such as for example the voltage on capacitor 43, that is substantially the input voltage for at least a first portion of the second time interval that the first driver is controlled to enable the first switch, and to subsequently couple the second voltage in series between the first voltage and a power input of the first driver to supply voltage and current to the first driver for a second portion of the second time interval.

An embodiment may include configuring the control circuit to form the interim voltage includes configuring the control circuit to form a sequence to charge a first capacitor, such as for example capacitor 43, to substantially the input voltage and to subsequently couple the first capacitor in series between the input voltage and a second capacitor, such as for example capacitor 33, to store the interim voltage on the second capacitor wherein the control circuit continually repeats the sequence for the first time interval.

An embodiment may include forming the interim voltage on a capacitor, such as for example capacitor 43, that is referenced to the output voltage.

The method may have an embodiment that may further include configuring the control circuit to couple a first capacitor, such as for example capacitor 43, in series between the first voltage and a power input of the first driver to supply voltage and current to the first driver for a first portion of a second time interval that the first driver is controlled to enable the first switch and to subsequently couple the first capacitor to be charged to substantially the input voltage to form the second voltage for at least a second portion of the second time interval.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A control circuit for a high-side driver comprising:
the control circuit configured to form a first signal to control a high-side transistor and to form a second signal to control a low-side transistor to form an output voltage from a high-voltage;
a first input for receiving the high-voltage;
a second input for receiving an input voltage that is less than the high-voltage;
a first capacitor;
a second capacitor;
a first driver coupled to receive the first signal and configured to enable the high-side transistor in response to an asserted state of the first signal;
a second driver coupled to receive the second signal and configured to enable the low-side transistor in response to an asserted state of the second signal;
a voltage generation circuit configured to form a plurality of store cycles for at least a portion of the asserted state of the second signal, a first store cycle of the plurality of store cycles including alternately storing substantially the input voltage on the first capacitor to store a first charge on the first capacitor for a first portion of the first store cycle, and to subsequently couple the first capacitor in series with the input voltage to form a second charge and a second voltage on the second capacitor for a second portion of the first store cycle; and the voltage generation circuit configured to form a plurality of maintain cycles for at least a portion of the asserted state of the first signal, a first maintain cycle of the plurality of maintain cycles including coupling the first capacitor in series between the second capacitor and the high-voltage for a first portion of the first maintain cycle, and subsequently storing substantially the input voltage on the first capacitor to store the first charge on the first capacitor for a second portion of the first maintain cycle.

2. The voltage generation circuit of claim 1 wherein the voltage generation circuit is configured to couple the second capacitor to the first driver in response to asserting first signal.

3. The voltage generation circuit of claim 1 including transferring at least a portion of the first charge to the second capacitor for the second portion of the first store cycle.

4. The voltage generation circuit of claim 1 wherein the control circuit is configured to inhibit forming both the store cycles and the maintain cycles in response to negating both the first signal and the second signal.

5. The voltage generation circuit of claim 1 wherein the control circuit is configured to continue forming the store cycles in response to asserting the second signal for at least a portion of the interval that the first signal remains negated.

6. The voltage generation circuit of claim 1 wherein the control circuit includes a first transistor coupled to a first terminal of the first capacitor and also coupled to receive the high-voltage wherein the control circuit enables the first transistor to couple the first capacitor in series between the second capacitor and the high-voltage for the first portion of the first maintain cycle.

7. The voltage generation circuit of claim 1 wherein the voltage generation circuit includes a first transistor coupled to a first terminal of the first capacitor and wherein the control circuit enables the first transistor to couple the first capacitor in series between the input voltage and a common reference voltage to store the first charge on first capacitor.

8. The voltage generation circuit of claim 7 wherein the voltage generation circuit includes a second transistor coupled to the first terminal of the first capacitor and also coupled to receive the high-voltage wherein the control circuit enables the second transistor to couple the first capacitor in series between the second capacitor and the high-voltage for the first portion of the first maintain cycle.

9. The voltage generation circuit of claim 7 wherein the voltage generation circuit includes a second transistor coupled to a first terminal of the second capacitor and also coupled to a power input of the first driver wherein the voltage generation circuit enables the second transistor to couple the second capacitor to supply current to the first driver in response to asserting the first signal.

10. A method of forming a control circuit for a high-side driver comprising:

configuring the control circuit to control a first driver to operate a first switch and to control a second driver to operate a second switch to form an output voltage from a first voltage;

configuring the control circuit to receive an input voltage and to form an operating voltage for the second driver from the input voltage;

configuring the control circuit to store on a first capacitor an interim voltage that is no less than substantially twice the input voltage wherein the control circuit is configured to store the interim voltage on the first capacitor for at least a portion of a first time interval that the second switch is enabled;

configuring the control circuit to couple the first capacitor to supply current and voltage to operate the first driver in response to controlling the first driver to enable the first switch wherein the first capacitor is referenced to substantially the output voltage; and configuring the control circuit to couple a second capacitor in series between the first voltage and the first capacitor to supply current and voltage to the first driver for a second time interval that the first driver is controlled to enable the first switch and to subsequently charge the second capacitor from the input voltage for a third time interval that the first driver is controlled to enable the first switch.

11. The method of claim 10 further including configuring the control circuit to initiate the second time interval in response to controlling the first driver to enable the first switch.

12. The method of claim 10 wherein configuring the control circuit for a sequence to store on the first capacitor the interim voltage includes configuring the control circuit to couple the second capacitor to be charge to substantially the input voltage for a first portion of the first time interval and to subsequently be coupled between the input voltage and second capacitor to store the interim voltage on the first capacitor for a second portion of the first time interval.

13. The method of claim 12 further including configuring the control circuit to continually repeat the sequence for the first time interval.

14. The method of claim 10 wherein configuring the control circuit to couple the second capacitor in series between the first voltage and the first capacitor includes referencing the second capacitor to the output voltage.

15. The method of claim 10 wherein configuring the control circuit to couple the second capacitor in series between the first voltage and the first capacitor includes coupling a first transistor to receive the first voltage and to couple the first voltage to a first terminal of the second capacitor wherein a second terminal of the second capacitor is coupled to the first capacitor.

16. A method of forming semiconductor device comprising:

configuring a control circuit to control a first driver to operate a first switch and to control a second driver to operate a second switch to form an output voltage from a first voltage;

configuring an input of the control circuit for receiving an input voltage;

configuring the control circuit to form an interim voltage that is greater than the input voltage including forming the interim voltage for at least a portion of a first time interval that the second switch is enabled wherein the interim voltage is formed from the input voltage; and configuring the control circuit to couple the first driver to receive substantially the interim voltage to supply current and voltage to operate the first driver in response to controlling the first driver to enable the first switch for a second time interval wherein the control circuit is configured to form a second voltage that is substantially the input voltage for a first portion of the second time interval and to subsequently couple the second voltage in series between the first voltage and a power input of the first driver to supply voltage and current to the first driver for a second portion of the second time interval.

17. The method of claim 16 wherein configuring the control circuit to form the interim voltage includes configuring the control circuit to form a sequence to charge a first capacitor to substantially the input voltage and to subsequently couple the first capacitor in series between the input voltage and a second capacitor to store the interim voltage on the second capacitor wherein the control circuit continually repeats the sequence for the first time interval.

18. The method of claim 16 further including forming the interim voltage on a capacitor that is referenced to the output voltage.

19. The method of claim 16 further including configuring the control circuit to couple a first capacitor in series between the first voltage and the power input of the first driver for the second portion of the second time interval and to subsequently couple the first capacitor to be charged to substantially the input voltage to form the second voltage for the first portion of the second time interval.

20. The method of claim 16 further including configuring the control circuit to repeat the sequence of forming the second voltage and subsequently coupling the second voltage in series between the first voltage and the power input, wherein the control circuit is configured to repeat the sequence for another portion of the second time interval.

* * * * *